United States Patent
Fujiwara et al.

(10) Patent No.: US 10,062,419 B2
(45) Date of Patent: Aug. 28, 2018

(54) DIGTIAL CIRCUIT STRUCTURES

(71) Applicant: TAIWAN SEMICONDUCTOR MANUFACTURING COMPANY LTD, Hsinchu (TW)

(72) Inventors: Hidehiro Fujiwara, Hsin-Chu (TW); Chih-Yu Lin, Taichung (TW); Wei-Cheng Wu, Hsinchu (TW); Yen-Huei Chen, Hsinchu County (TW); Hung-Jen Liao, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/830,599

(22) Filed: Dec. 4, 2017

(65) Prior Publication Data
US 2018/0090183 A1    Mar. 29, 2018

Related U.S. Application Data

(62) Division of application No. 14/985,397, filed on Dec. 31, 2015, now Pat. No. 9,837,130.

(51) Int. Cl.
| | |
|---|---|
| G11C 11/00 | (2006.01) |
| H01L 27/088 | (2006.01) |
| G11C 7/02 | (2006.01) |
| G11C 11/412 | (2006.01) |
| G11C 11/419 | (2006.01) |

(52) U.S. Cl.
CPC .............. *G11C 7/02* (2013.01); *G11C 11/412* (2013.01); *G11C 11/419* (2013.01)

(58) Field of Classification Search
None
See application file for complete search history.

(56) References Cited

U.S. PATENT DOCUMENTS 6,700,166 B2 *  3/2004  Yoshizawa .......... G11C 11/4125
                                                    257/393

* cited by examiner

*Primary Examiner* — Harry W Byrne
*Assistant Examiner* — Sultana Begum
(74) *Attorney, Agent, or Firm* — WPAT, P.C., Intellectual Property Attorneys; Anthony King

(57) ABSTRACT

In accordance with some embodiments of the present disclosure, a circuit structure is provided. The circuit structure comprises a first transistor, a second transistor, a storage node and a word-line. Each of the two transistors comprises a gate, a source and a drain. The storage node is connected to the gate of the first transistor. The word-line is connected to the gate of the second transistor. The first and second transistors are serially connected. The first and second threshold voltages are respectively associated with the first and second transistors, and the first threshold voltage is lower than the second threshold voltage.

20 Claims, 17 Drawing Sheets

DIGTIAL CIRCUIT STRUCTURES

CROSS-REFERENCE TO RELATED APPLICATIONS

This application is a division of U.S. application Ser. No. 14/985,397, filed on Dec. 31, 2015, and claims priority thereto.

BACKGROUND

The present disclosure relates to digital circuits and related circuit structures.

The exponential growth of digital computing power, demanded by modern applications, has been realized thanks to Moore's Law: the doubling of the number of transistors available per unit area approximately every 18 months, rendered possible by the incessant scale-down of the transistor size. To prevent the amount of power consumption from growing explosively, system voltages are consistently decreasing.

When the digital circuit is operated at a low system voltage, new challenges appear. In particular, the effect of leakage current, sometimes called "off current," manifests itself more prominently under low system voltage. At the same time, it is desirable to maintain the amount of operating current, sometimes called "on current," to achieve certain performance criteria. Therefore, it is desirable to control the amount of leakage current to the maximum extent possible without sacrificing too much on the operating current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
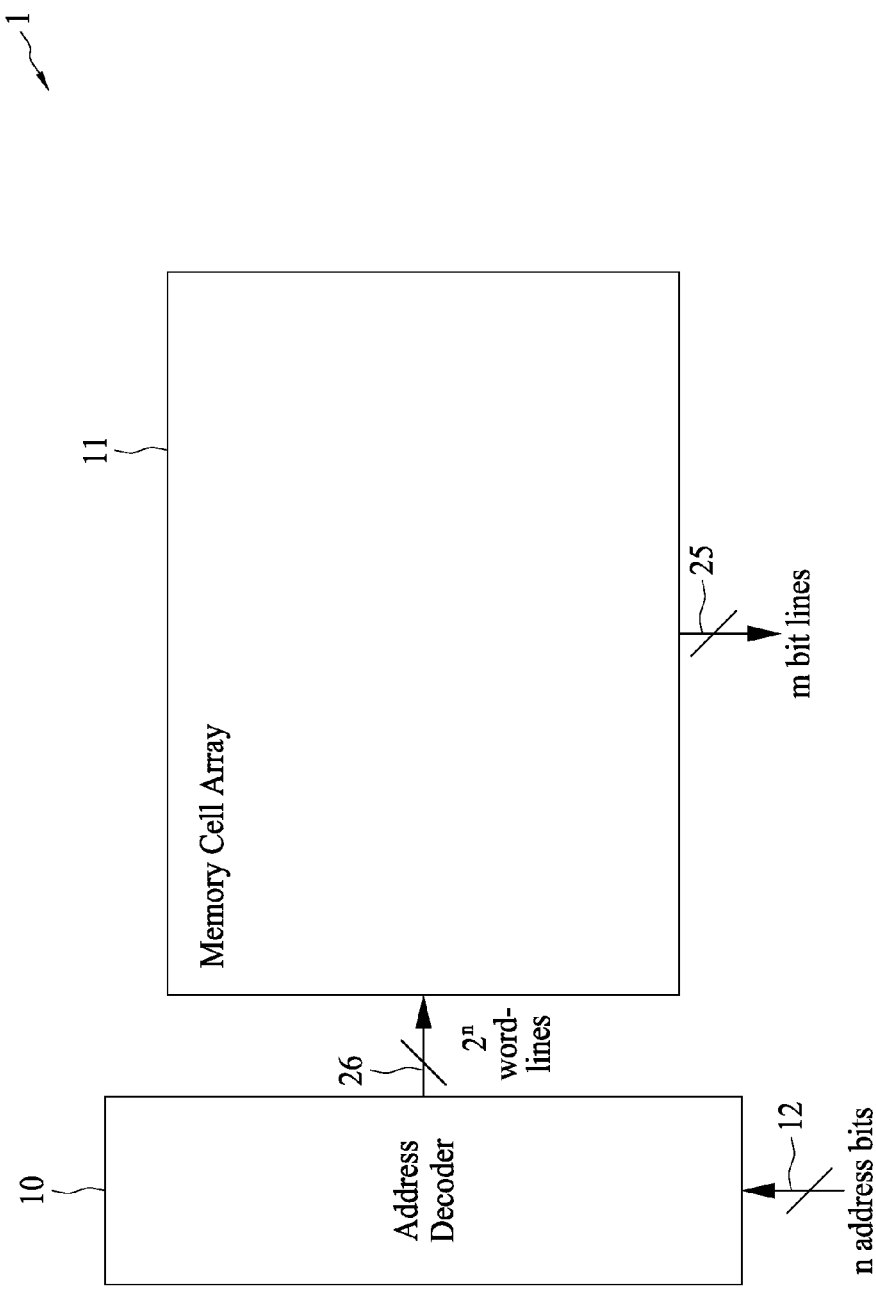
FIG. 1 illustrates a block diagram of a digital memory circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure generally relates to digital circuits. Memory circuits/systems are an important class of digital circuits and will be discussed in greater detail below. Logic circuits are another important class of digital circuits and will also be discussed.

FIG. 1 is a high-level block diagram of a memory 1 in accordance with one embodiment of the present disclosure. Referring to FIG. 1, the memory 1 comprises an address decoder 10 and a memory cell array 11. The memory cell array 11 comprises a certain number (which can be large) of memory cells that are capable of storing information. The address decoder 10 may take n address bits as input 12 and decode the n bits to identify the desired memory cell/block to be read/written by properly setting the signals on the $2^n$ word-lines 26 connected to the memory cell array 11. Also connected to the memory 1 are m bit-lines 25. After a read operation, the results appear at the bit-lines 25. The memory 1 may comprise other components, such as clock circuits and sense amplifiers, which are not illustrated in FIG. 1 in the interest of clarity. The memory 1 may be of any suitable type, such as SRAM, DRAM, NV-SRAM (e.g., STT-MRAM, RRAM, Flash . . . ), or any other types of suitable memory.

Figure 2A:
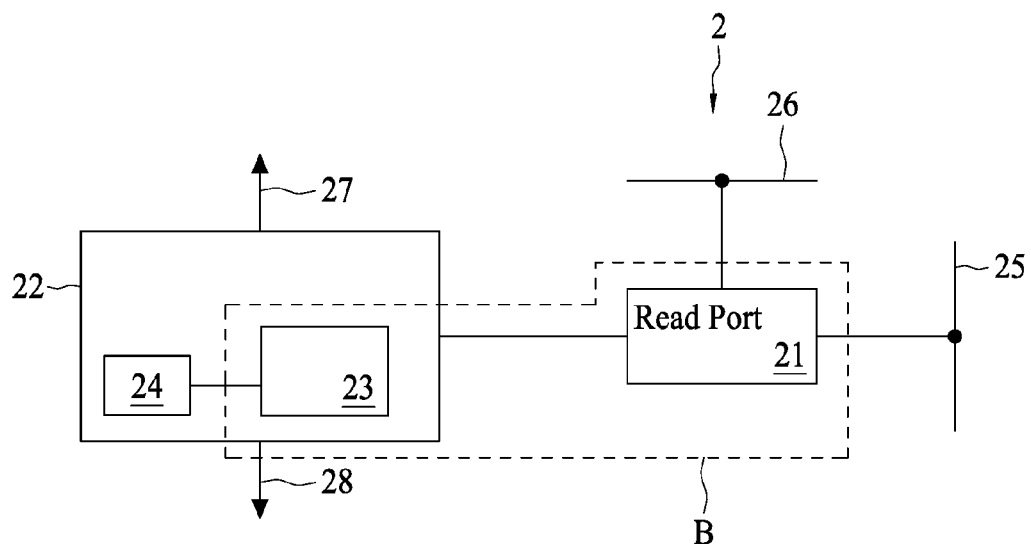
FIG. 2A illustrates a memory cell in accordance with some embodiments of the present disclosure.

Refer to FIG. 2A, which illustrates a memory cell 2 that may appear in the memory cell array 11 in FIG. 1, in accordance with an embodiment of the present disclosure. The memory cell 2 comprises a read port 21 connected to a bit-line 25 and a word-line 26, and a memory element 22 connected to a system voltage 27 and a ground 28. The memory element 22 comprises a pulling element 23 (connected to the read port 21) and an information storage 24. In some embodiments, the memory cell 2 may comprise other circuits/blocks not illustrated in FIG. 2A.

The read port 21 is associated with a read-port threshold voltage, which determines a threshold that a voltage applied to the read port 21 should exceed in order to make the read port 21 operate. In some embodiments, the read port 21 comprises a transistor, such as a field-effect transistor (FET), and the read-port threshold voltage would then be associated with the threshold voltage of the FET. The voltage at the word-line 26 controls the operation of the read port 21 and is set to appropriate analog/digital values during read/write operations. The bit-line 25 reflects the information read out from the information storage 24 during a read operation and is presented with information to be written to the information storage 24 during a write operation.

The memory element 22 is connected to the system voltage 27 and the ground 28. The system voltage 27 supplies necessary current and power to the memory cell 2. The ground 28 provides a path for discharge currents and in some embodiments may be replaced with a negative system voltage.

The pulling element 23 serves as an intermediary between the information storage 24 and the read port 21. In some embodiments, the pulling element 23 is connected to the ground 28 so as to pull down its output when necessary. In some embodiments, the pulling element 23 is connected to the system voltage 27 for pulling up.

The information storage 24 holds information stored in the memory element 22 in the memory cell 2. In some embodiments, the information storage 24 is capable of holding one bit of information, such as a logical 0 or 1. In some embodiments, the information storage 24 is electric, such as a capacitor, in which case a HIGH voltage may represent a logical 1 and a LOW voltage, a logical 0. The voltage values corresponding to HIGH and LOW may depend on, among other factors, the system voltage and the circuit design. The information storage 24 may also be magnetic, and other types of information storage 24 are also possible.

Figure 2B:
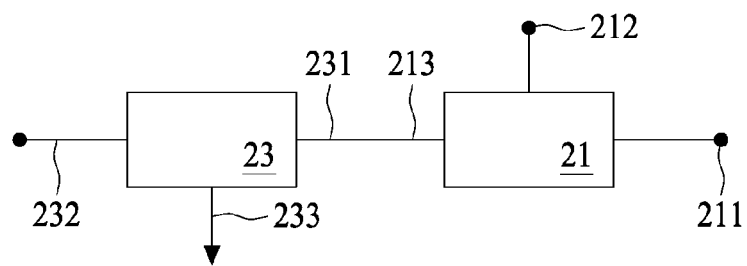
FIG. 2B illustrates a part of a memory cell in accordance with some embodiments of the present disclosure.

Referring to FIG. 2B, part of a memory cell 2 is surrounded by a dash-line circle B in FIG. 2A, including the read port 21 and the pulling element 23, in accordance with some embodiments of the present disclosure. The read port 21 may comprise three terminals: a first terminal 211, a second terminal 212 and a third terminal 213. The pulling element 23 may also comprise three terminals: a first terminal 231, a second terminal 232 and a third terminal 233. In some embodiments, the third terminal 213 of the read port 21 and the first terminal 231 of the pulling element 23 are connected. The first terminal 211 and second terminal 212 of the read port 21 may be respectively connected to a bit-line and a word-line. The second terminal 232 and the third terminal 233 of the pulling element 23 may be respectively connected to a storage node (not shown) and a ground.

The read operation is explained with reference to FIG. 2B, assuming that the storage node connected to the second terminal 232 of the pulling element 23 is capable of storing one bit of information. At the beginning of a read operation, the first terminal 211, connected to a bit-line, is raised (pre-charged). The second terminal 212, connected to a word-line, is then set to an appropriate value to activate the read port 21 and create an electric communication path between the first and third terminals 211, 213 of the read port 21, thereby allowing the first terminal 211 to reflect the voltage at the third terminal 213. The bit value stored at the second terminal 232 (the storage node) of the pulling element 23 determines the voltage at the first terminal 231, thereby also determining the voltage at the first and third terminals 211, 213 of the read port 21. If the bit value is such that an electric path exists between the first and third terminals 231, 233 of the pulling element 23, such path pulls down the voltage at the first terminal 231 of the pulling element 23 and also the first and third terminals 211, 213 of the read port 21. If, on the other hand, the bit value is such that no electric path exists between the first and third terminals 231, 233 of the pulling element 23, then the voltage at the first terminal 231 of the pulling element 23 (and the third terminal 213 of the read port 21) remains substantially the same as the first terminal 211 of the read port 21.

Figure 2C:
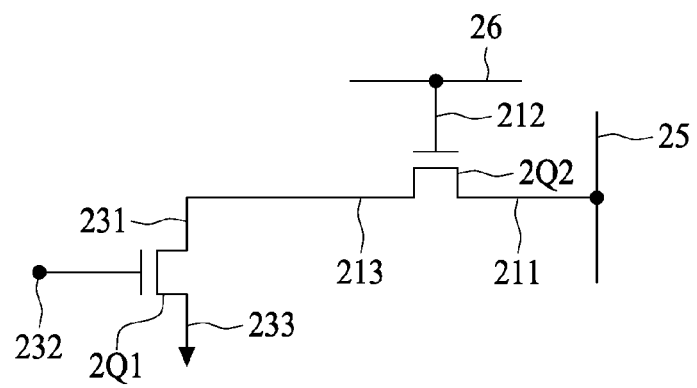
FIG. 2C illustrates a circuit structure in accordance with some embodiments of the present disclosure.

After the explanation on how the information stored at the second terminal 232 of the pulling element 23 passes to the first terminal 211 of the read port 21, please refer to FIG. 2C for a circuit implementation of the block diagram illustrated in FIGS. 2A and 2B, in accordance with some embodiments of the present disclosure.

FIG. 2C illustrates two serially connected NMOS transistors 2Q1, 2Q2. In some embodiments, other types of circuit elements may also be possible, such as PMOS transistors and non-FET type circuit elements. The transistor 2Q1 comprises first, second and third terminals 231, 232, 233 and acts as the pulling element 23 shown in FIG. 2B. In some embodiments, the first, second and third terminals 231, 232, 233 of the transistor 2Q1 are respectively the drain, gate and source of an NMOS transistor. The transistor 2Q2 comprises first, second and third terminals 211, 212, 213 and acts as the read port 21 shown in FIG. 2B. In some embodiments, the first, second and third terminals 211, 212, 213 of the transistor 2Q2 are respectively the drain, gate and source of an NMOS transistor. The first and second terminals 211, 212 of the transistor 2Q2 may be respectively connected to the bit-line 25 and the word-line 26. The second terminal 232 and the third terminal 233 of the transistor 2Q1 may be respectively connected to a storage node (not shown) and a ground.

The transistor 2Q1 is associated with a first threshold voltage $V_{th1}$ and the transistor 2Q2 is associated with a second threshold voltage $V_{th2}$. $V_{th1}$ and $V_{th2}$ may be controlled by the manufacturing process, such as the amount of doping in various regions of the fabricated transistors. In some embodiments, the transistors 2Q1, 2Q2 are FETs, so $V_{th1}$ and $V_{th2}$ may also be controlled by the amount of body voltages (not shown in FIG. 2C) applied to the transistors 2Q1, 2Q2. Controlling $V_{th1}$ and $V_{th2}$ by body voltages may simplify the manufacturing process because the amount of doping may be more uniform across the wafer. Controlling $V_{th1}$ and $V_{th2}$ by varying doping amounts, on the other hand, may give more flexibility to the circuit designer.

If the voltage at the second terminal 232 is high, then during the read operation where the bit-line 25 is pre-charged and the word-line 26 is raised, both transistors 2Q1, 2Q2 will be conducting, thereby pulling down the voltage at the bit-line 25. The result is that a logical 0 is read. If, on the other hand, the voltage at the second terminal 232 is low, then the transistor 2Q1 will not be conducting even when the bit-line 25 is pre-charged and the word-line 26 is raised, in which case the voltage at the bit-line 25 is high, representing a logical 1.

Figure 3A:
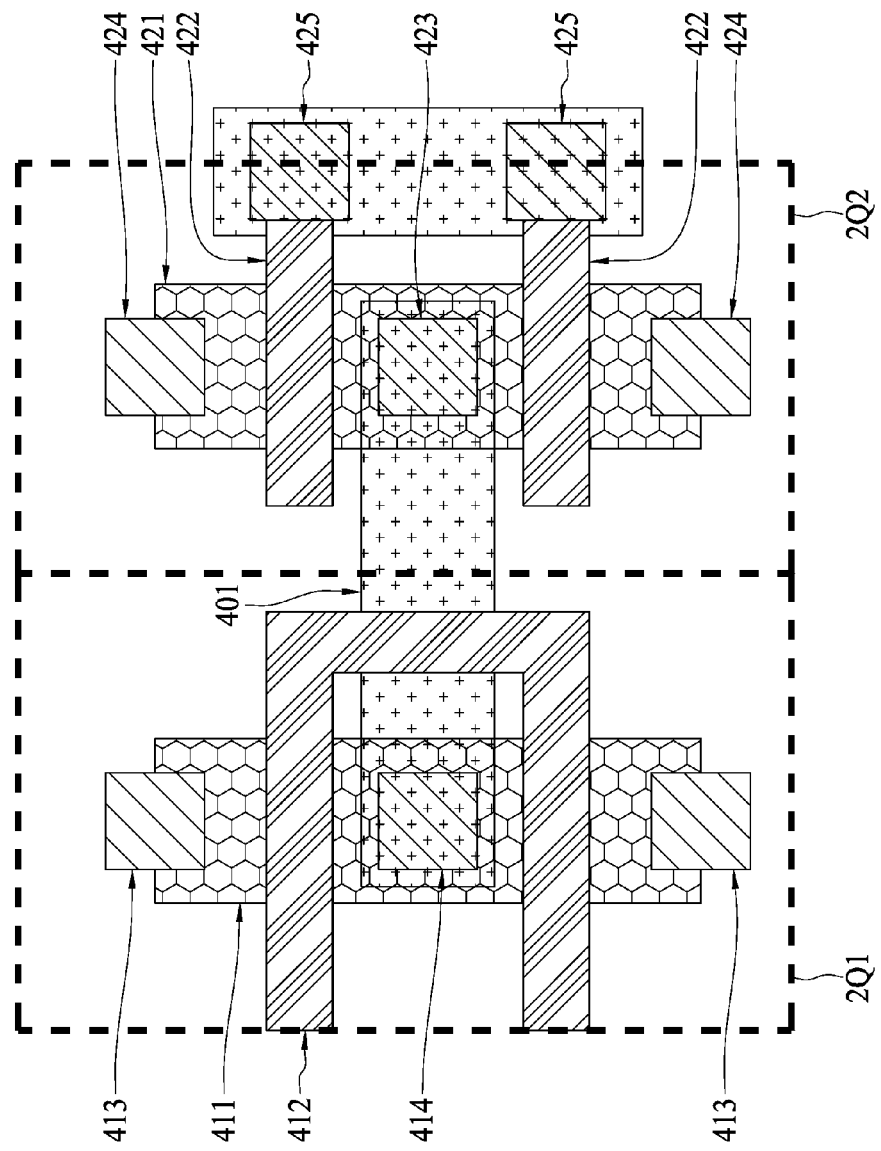
FIGS. 3A and 3B provide exemplary layouts of the circuit structures in accordance with some embodiments of the present disclosure.
Figure 3B:
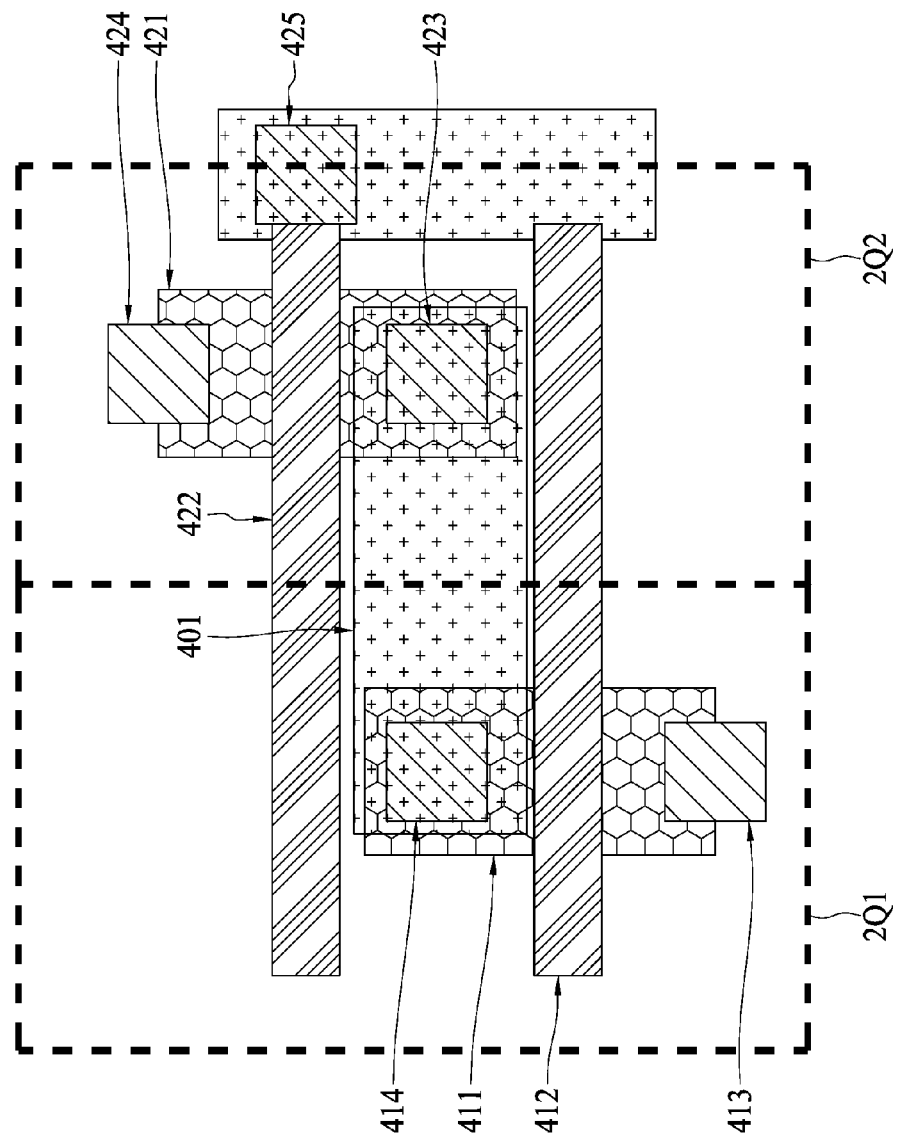

FIGS. 3A and 3B provide exemplary layouts of the circuit structures shown in FIG. 2C.

In FIG. 3A, the two rectangular areas surrounded by dashed lines respectively represent transistors 2Q1 and 2Q2. Refer to the transistor 2Q1. The vertical bar is the diffusion area 411 (e.g., oxide diffusion areas). The bent strip corresponds to the gate polysilicon 412 (which may be or comprise other suitable materials, such as metals and/or high-K materials). Among the three squares, the top and bottom ones may be source contacts 413, and the one in the middle may be the drain contact 414. The drain contact 414 of the transistor 2Q1 is coupled to the source contact 423 of the transistor 2Q2 via the conductive layer 401 (e.g., M1 or M2). Now, refer to the transistor 2Q2. The vertical bar is the diffusion area 421 (e.g., oxide diffusion areas). The two horizontal strips correspond to the gate polysilicons 422 (which may be or comprise other suitable materials, such as metals and/or high-K materials), which may be coupled to the word-line 26 (see also FIG. 2C) via contacts 425. Among the three squares, the one in the middle may be the source contact 423; the top and bottom ones may be the drain contacts 424, which may be coupled to the bit-line 25 (see also FIG. 2C).

FIG. 3B provides a layout different from that in FIG. 3A. The main differences are that the diffusion area 411 of the transistors 2Q1 and 2Q2 in FIG. 3B is shorter and the gate polysilicon 412 of the transistor 2Q1 in FIG. 3B is straight, not bent. The layout in FIG. 3B trades off some amount of performance (e.g., speed) due to the reduced length of the diffusion area 411 in exchange for better manufacturability under processes involving advanced lithographic techniques because of the absence of bent patterns.

FIGS. 4A-4D illustrate different amount of currents that may be conducting under different voltages at the word-line and the storage node, according to some embodiments.

Figure 4A:
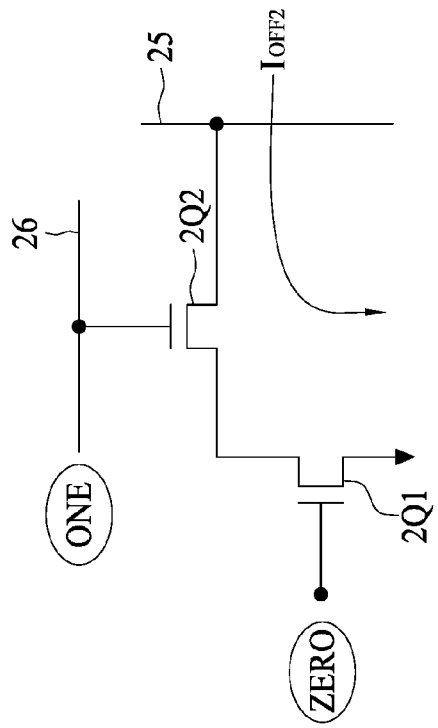
FIGS. 4A-4D illustrate the operation of the circuit structures in accordance with some embodiments of the present disclosure.

In FIG. 4A, a voltage corresponding to a logical 1 is presented at the storage node. Since the voltage at the gate of the transistor 2Q1 is high, the transistor 2Q1 is turned on and capable of conducting a significant amount of current. When the word-line 26 is raised (e.g., during a read operation), the transistor 2Q2 is turned on. Since both of the transistors 2Q1, 2Q2 are on, there would be a current $I_{ON}$ conducting between the bit-line 25 and the ground. The discharged bit-line 25 would result in a reading of a logical 0.

Figure 4B:
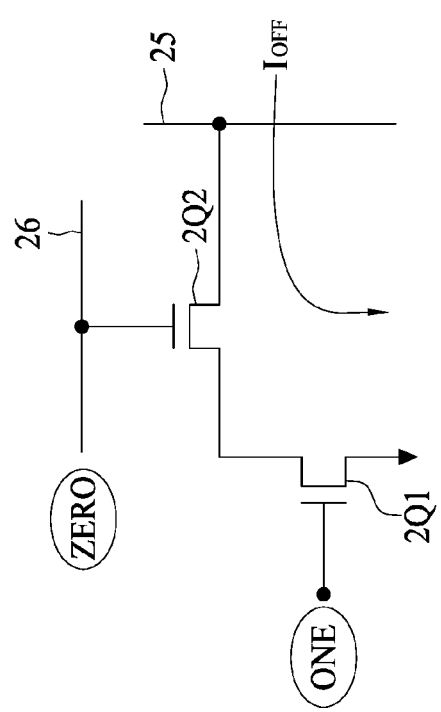

In FIG. 4B, a voltage corresponding to a logical 0 is presented at the storage node. Since the voltage at the gate of the transistor 2Q1 is low, the transistor 2Q1 is turned off and incapable of conducting a significant amount of current. When the word-line 26 is raised (e.g., during a read operation), the transistor 2Q2 is turned on. Since only one of the transistors 2Q1, 2Q2 is on, only a small amount of current $I_{OFF2}$ would be conducting, which is possibly due to a leakage current in the near- or sub-threshold region. The non-discharged bit-line 25 would result in a reading of a logical 1.

Figure 4C:
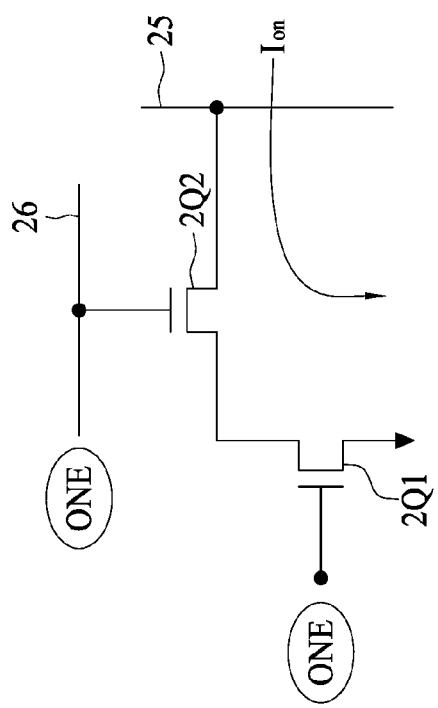

In FIG. 4C, a voltage corresponding to a logical 0 is presented at the storage node. Since the voltage at the gate of the transistor 2Q1 is low, the transistor 2Q1 is turned off and incapable of conducting a significant amount of current. When the word-line 26 is not raised (e.g., the memory cell is not being read), the transistor 2Q2 is also turned off. Since both of the transistors 2Q1, 2Q2 are off, only a small amount of current $I_{OFF3}$ would be conducting, which is possibly due to a leakage current in the near- or sub-threshold region.

Figure 4D:
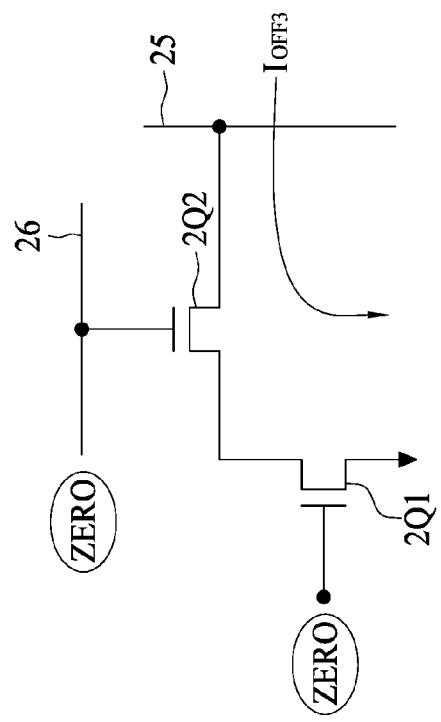

In FIG. 4D, a voltage corresponding to a logical 1 is presented at the storage node. Since the voltage at the gate of the transistor 2Q1 is high, the transistor 2Q1 is turned on and capable of conducting a significant amount of current. However, since the word-line 26 is not raised (e.g., the memory cell is not being read), the transistor 2Q2 is turned off. Since only one of the transistors 2Q1, 2Q2 is on, only a small amount of current $I_{OFF}$ would be conducting, which is possibly due to a leakage current in the near- or sub-threshold region on.

Figure 5A:
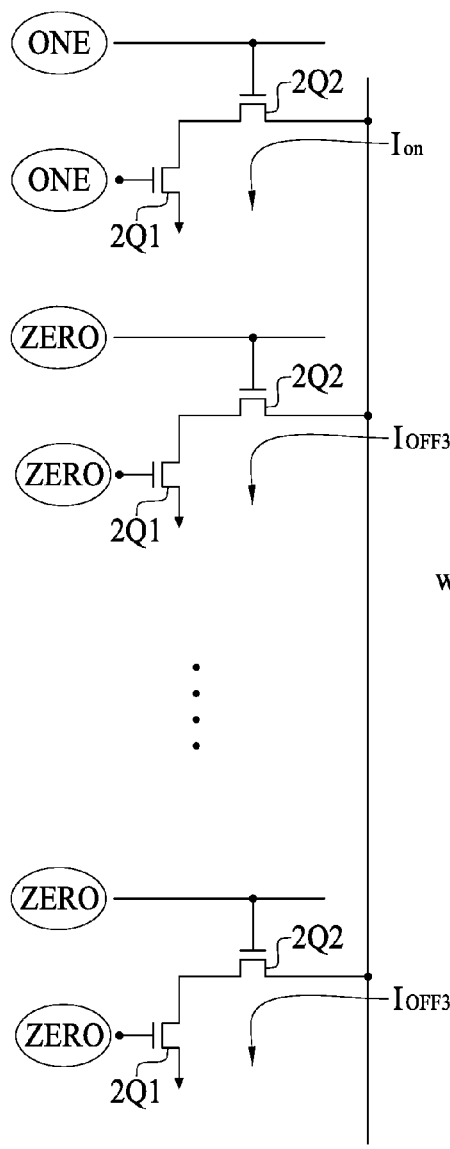
FIGS. 5A and 5B illustrate the operation of the circuit structures in accordance with some embodiments of the present disclosure.
Figure 5B:
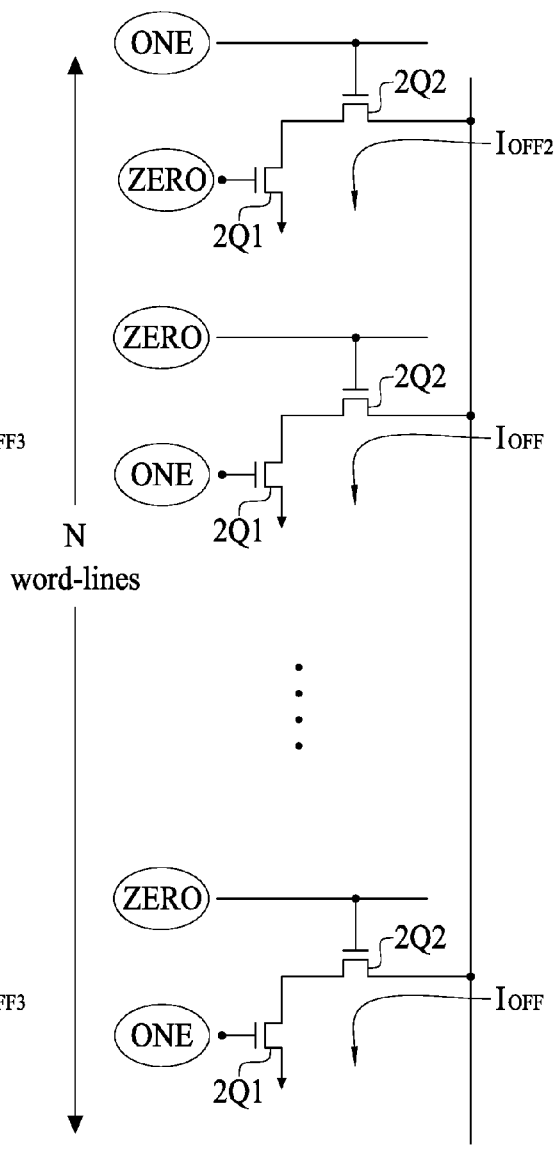

FIGS. 5A and 5B illustrate the amount of current on a bit-line connecting a column of, say, N memory cells while a logical 0 (FIG. 5A) and a logical 1 (FIG. 5B) are being read from one of the N memory cells, in accordance with some embodiments of the present disclosure. In some embodiments, the number N may be 8, 16, 32, 64, 128, 256, 512, 1024, or any other suitable numbers.

Please note that in a read operation, the bit-line is precharged and then the word-line is asserted.

FIG. 5A illustrates that a logical 0 is being read from the top-most memory cell and a current $I_{ON}$ is conducting. The word-lines connected to the other (N-1) memory cells are not raised. In the embodiment of FIG. 5A, logical 0s are presented at the storage node of the other (N-1) memory cells. Therefore, the total amount of conducting current would be $$[I_{ON}+(N-1)*I_{OFF3}] \qquad (1).$$

FIG. 5B illustrates that a logical 1 is being read from the top-most memory cell and a current $I_{OFF2}$ is conducting. The word-lines connected to the other (N-1) memory cells are not raised. In the embodiment of FIG. 5B, logical 1s are presented at the storage node of the other (N-1) memory cells. Therefore, the total amount of conducting current would be $$[I_{OFF2}+(N-1)*I_{OFF}] \qquad (2).$$

It has been realized that, in some embodiments, the difference between the amount of current when a logical 0 is being read and that when a logical 1 is being read may be as large as possible. One of the advantages of such a large difference is the reduction in reading errors. In other words, it is advantageous to reduce the likelihood that a logical 1 is being read when in fact a logical 0 should be read. Reduced numbers of reading errors increases the reliability of circuits and the manufacturing yield.

One way to increase the difference between the "0 read" and "1 read" currents is to make the amount in formula (1) be as greater than formula (2) as possible. Note that since N is usually larger than one, and significantly larger in some embodiments, the (N-1) term in formulas (1) and (2) may be dominant. Therefore, it may be required that:

$$I_{ON}>>(N-1)*I_{OFF} \qquad (3).$$

In some embodiments, the transistors in FIGS. 5A and 5B are operated in near- and/or sub-threshold regions, in which $I_{OFF}$ may be associated with the threshold voltage of the transistors. Thus, one possible way to achieve the condition of equation (3) is to increase the threshold voltage of the transistors. There might be a trade-off, however, because the circuit speed decreases if the threshold voltage is too high.

It has been realized that although the amount of $I_{OFF}$ is associated with the threshold voltage of the transistors, this degree of association is not uniform across all transistors. In other words, $I_{OFF}$ may depend on the threshold voltage of some transistors more than the threshold voltage of other transistors. Therefore, the threshold voltage of only the transistors whose threshold voltage more strongly affects $I_{OFF}$ may be increased.

Referring to the second memory cell in FIG. 5B, the transistor 2Q1 is conducting and the transistor 2Q2 is not. Therefore, $I_{OFF}$ may depend more on the threshold voltage of the transistor 2Q2 than that of the transistor 2Q1. Thus, the threshold voltage of the transistor 2Q2 may be raised to be higher than that of the transistor 2Q1, thereby providing a solution to the above-mentioned trade-off.

Figure 6A:
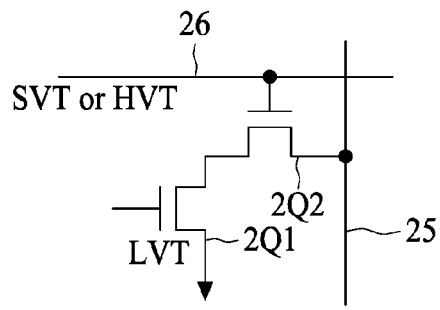
FIG. 6A illustrates a circuit structure in accordance with some embodiments of the present disclosure.

FIG. 6A illustrates a circuit structure in accordance with some embodiments of the present disclosure. In FIG. 6A, LVT, SVT and HVT respectively stand for "low threshold voltage," "standard threshold voltage" and "high threshold voltage." As described previously, the threshold voltage may be varied by different amounts of doping, different body-bias voltages, or any other suitable methods.

In FIG. 6A, the threshold voltage of the transistor 2Q2 is set to be higher than that of the transistor 2Q1. As explained before, $I_{OFF}$ depends more on the threshold voltage of the transistor 2Q2 than that of the transistor 2Q1, so $I_{OFF}$ may be decreased. Additionally, since the threshold voltage of the transistor 2Q1 is lower, the circuit speed may be improved.

Figure 6B:
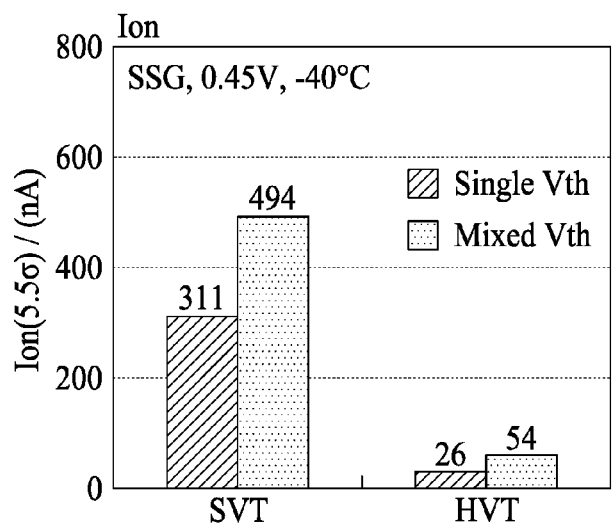
FIGS. 6B-6D illustrate computer simulations on the effects to the circuits employing the circuit structures in accordance with some embodiments of the present disclosure.
Figure 6C:
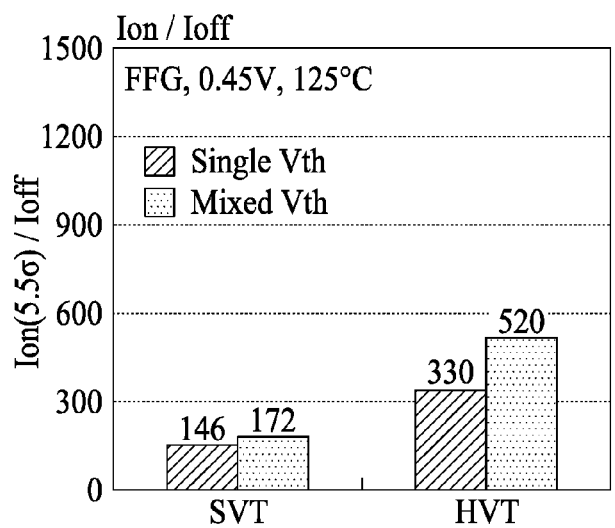

FIGS. 6B and 6C illustrate computer simulations on the effects to the digital circuits employing the circuit structures and design techniques according to some embodiments of the present disclosure.

FIG. 6B illustrates the effect on $I_{ON}$ at the SS (slow-slow) corner and a low temperature (−40° C.). Since the amount of transistor current decreases at slow corners and at low temperatures, FIG. 6B represents a worst-case scenario for $I_{ON}$. It can be seen that assigning different threshold voltages to different transistors effectively increases the amount of $I_{ON}$, which is desirable.

FIG. 6C illustrates the effect on $I_{ON}/I_{OFF}$, an indication of the difference between the two amounts of current, at the FF (fast-fast) corner and a high temperature (125° C.). As the amount of transistor current increases in temperature and at fast corners, FIG. 6C represents a worst-case simulation for $I_{ON}/I_{OFF}$. It can be seen that assigning different threshold voltages to different transistors effectively increases the ratio $I_{ON}/I_{OFF}$, which is also desirable.

Figure 6D:
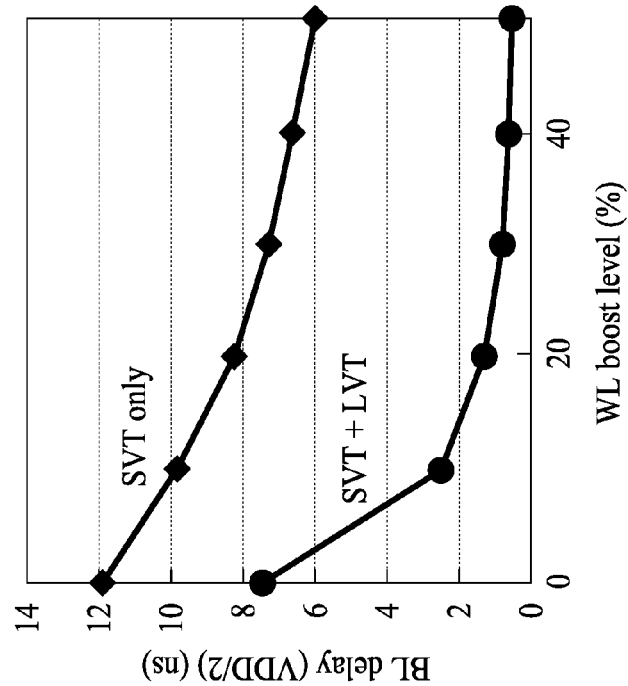
Figure 6D:
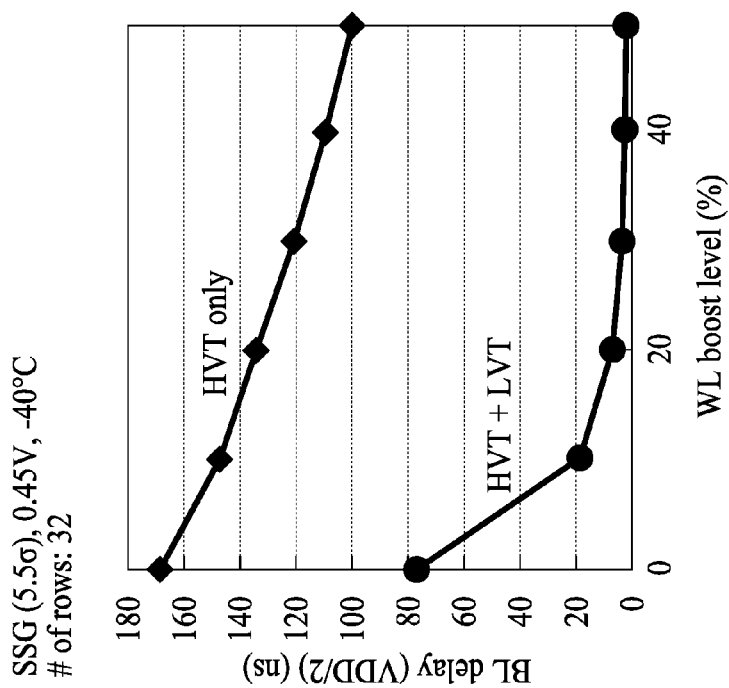

Circuit performance may be further enhanced by combining the multiple threshold voltage technique with other ones. FIG. 6D illustrates one embodiment: By combining the multiple threshold voltage technique according to the embodiments of the present disclosure, the effect of a word-line (WL) boost improves.

Figure 7A:
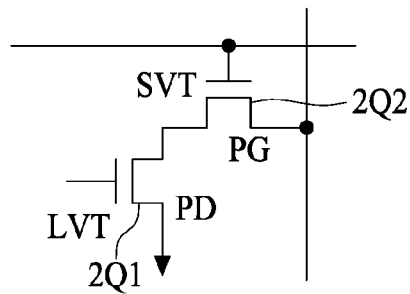
FIG. 7A illustrates a circuit structure in accordance with some embodiments of the present disclosure.
Figure 7B:
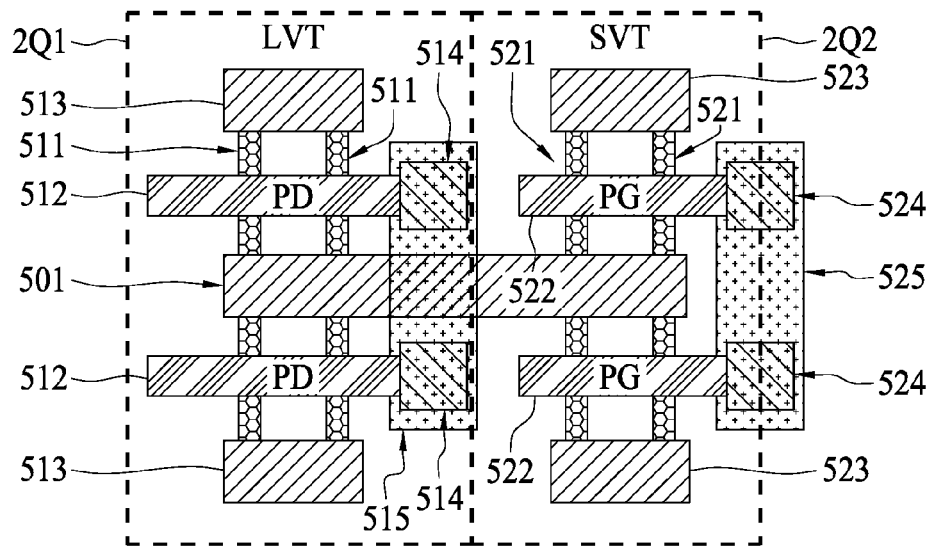
FIGS. 7B and 7C provide exemplary layouts of the circuit structures in accordance with some embodiments of the present disclosure.
Figure 7C:
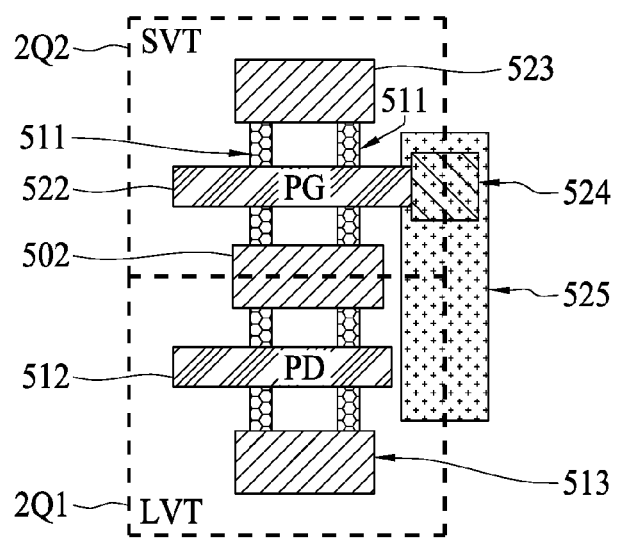

FIG. 7A illustrates an embodiment of the present disclosure. FIGS. 7B and 7C provide exemplary layouts of the circuit structure of FIG. 7A. For ease of reference to the layout, the transistor 2Q1 is marked as "PD" and the transistor 2Q2 is marked as "PG" in FIGS. 7A-7C. In contrast with the layout in FIG. 3A, the patterns in FIG. 7B or 7C are straight rectangles/squares without any bent, which makes the layouts in FIGS. 7B and 7C better suitable for manufacturing processes involving advanced lithography that permits fine resolution because the advanced lithography is more prone to errors during the exposure of bent patterns. Additionally, the parts that couple the two transistors 2Q1 and 2Q2 are the contact 501 (in FIG. 7B) and the contact 502 (in FIG. 7C), not the conductive layer (such as M1) as in FIGS. 3A and 3B; this arrangement of the layouts of FIGS. 7B and 7C may serve to reduce the amount of metal used in the conductive layer (such as M1).

Refer to FIG. 7B. The transistor 2Q1 comprises diffusion areas 511, gate polysilicons 512 (and/or other suitable materials for the gate terminal), contacts 513 and 514 that may couple the transistor 2Q1 to other circuit elements, a conductive layer 515, and a contact 501 that is shared with the transistor 2Q2. The contact 501 represents the node coupling the drain of the transistor 2Q1 to the source of the transistor 2Q2. Similarly, the transistor 2Q2 comprises diffusion areas 521, gate polysilicons 522 (and/or other suitable materials for the gate terminal), contacts 523 and 524, a conductive layer 525, and the contact 501 shared with the transistor 2Q1.

FIG. 7C provides an alternative layout, in which the two transistors 2Q1 and 2Q2 share the diffusion areas 511 and the contact 502 couples the drain of the transistor 2Q1 to the source of the transistor 2Q2. Compared with the layout in FIG. 7B, the layout in FIG. 7C may occupy less chip area.

Figure 8A:
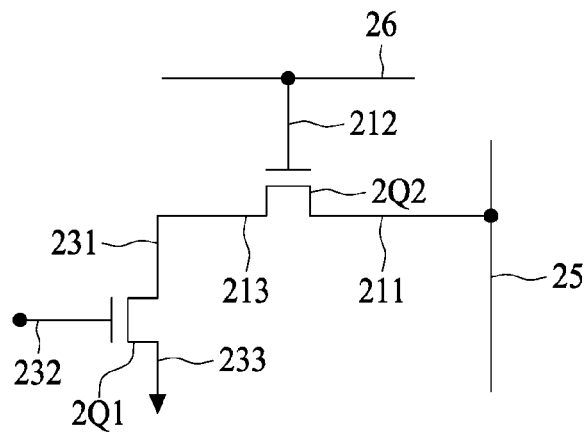
FIGS. 8A-8C illustrate circuit structures in accordance with some embodiments of the present disclosure.
Figure 8B:
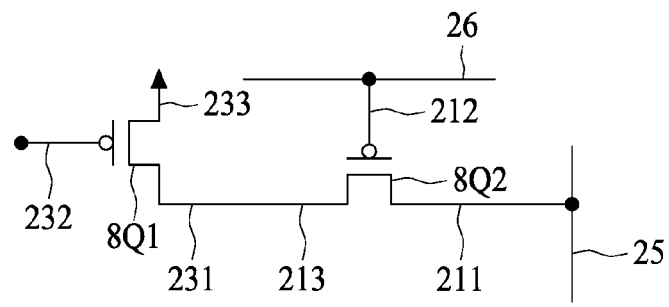
Figure 8C:
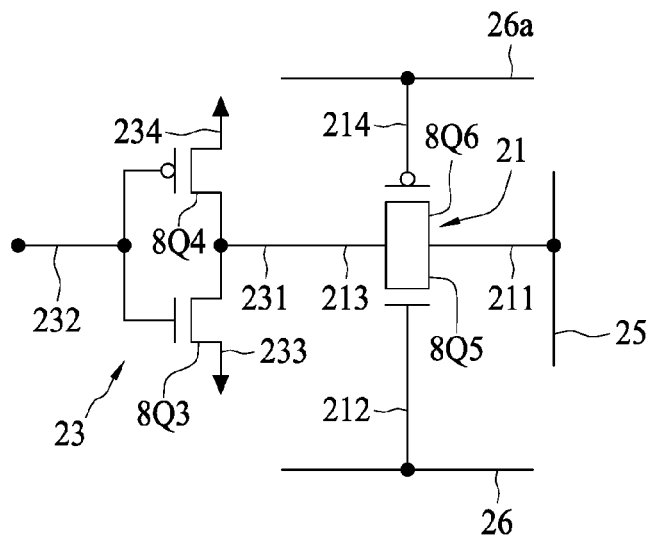

FIGS. 8A-8C illustrate circuit structures according to the embodiments of the present disclosure. FIG. 8A is substantially similar to FIG. 2C, so the description of which is omitted for brevity.

FIG. 8B illustrates two serially connected PMOS transistors 8Q1, 8Q2. Like the transistor 2Q1, the transistor 8Q1 comprises first, second and third terminals 231, 232, 233. In some embodiments, the first, second and third terminals 231, 232, 233 of the transistor 8Q1 are respectively the drain, gate and source of a PMOS transistor. Like the transistor 2Q2, the transistor 8Q2 comprises first, second and third terminals 211, 212, 213. In some embodiments, the first, second and third terminals 211, 212, 213 of the transistor 8Q2 are respectively the source, gate and drain of a PMOS transistor. The first and second terminals 211, 212 of the transistor 8Q2 may be respectively connected to the bit-line 25 and the word-line 26. The second terminal 232 and the third terminal 233 of the transistor 8Q1 may be respectively connected to a storage node (not shown) and a system voltage.

FIG. 8C illustrates a circuit structure according to an embodiment in which the read port 21 and the pulling element 23 of FIG. 2B are implemented by NMOS and PMOS transistors. Specifically, the transistors 8Q5, 8Q6 constitute the read port 21 and the transistors 8Q3, 8Q4 constitute the pulling element 23.

One difference between the circuit structure in FIG. 8C and those in FIGS. 8A and 8B is that each of the read port 21 and the pulling element 23 in FIG. 8C comprise four terminals. The fourth terminal 214 of the transistor pair 8Q5, 8Q6 is connected to a complementary word-line 26a. The term "complementary" indicates that the signal on the complementary word-line 26a is complementary (e.g., the logical inverse of) to that on the word-line 26. The transistor pair 8Q3, 8Q4 is connected to the ground via the third terminal 233 and to the system voltage via a fourth terminal 234, thereby providing both pull-up and pull-down paths. Since the circuit structure in FIG. 8C provides both a charge path and a discharge path, the circuit structure in FIG. 8C may offer improved stability over circuit structures with only a charge path or only a discharge path.

Figure 9:
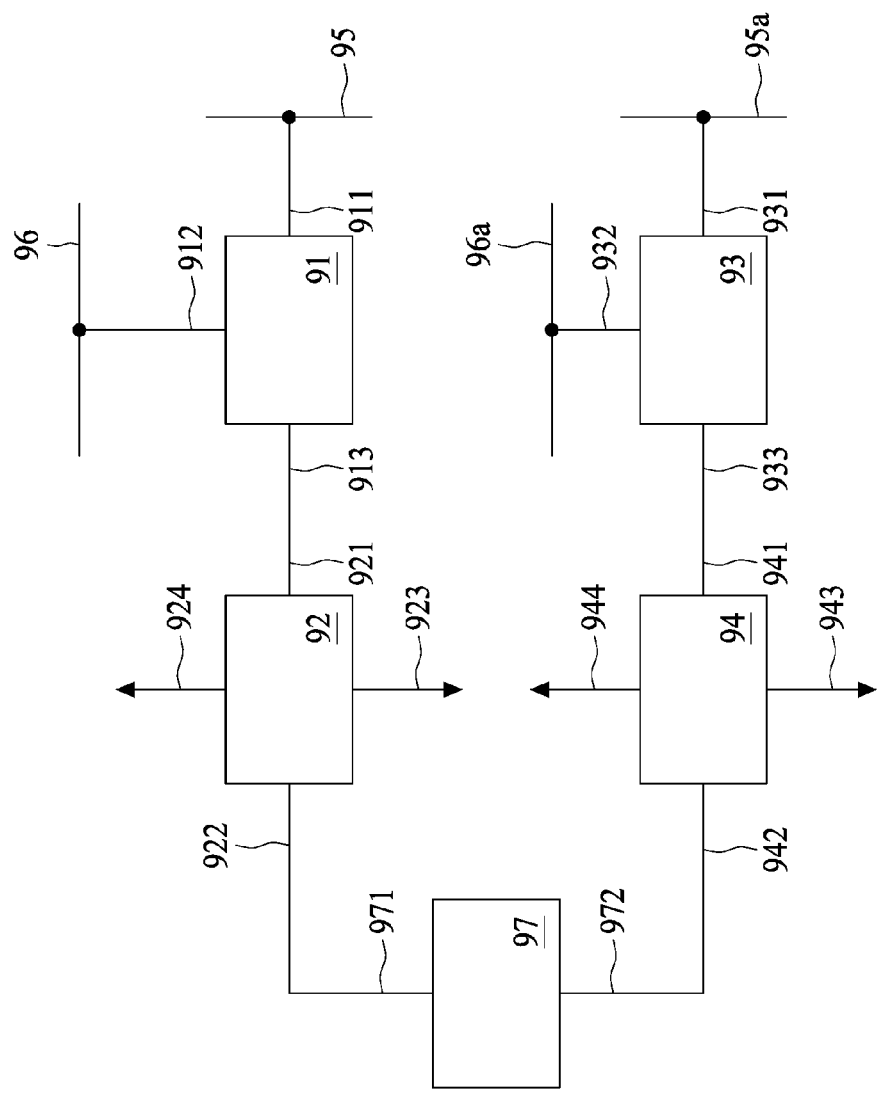
FIG. 9 illustrates the block diagram of a circuit structure in accordance with some embodiments of the present disclosure.

FIG. 9 illustrates the block diagram of a circuit structure according to some embodiments of the present disclosure. The main difference between FIGS. 2 and 9 is that FIG. 9 additionally comprises a "complementary" part, such as a complementary read port 93, a complementary pulling element 94, a complementary bit-line 95a and a complementary word-line 96a.

The read port 91, similar to the read port 21, comprises a first terminal 911 connected to a bit-line 95, a second terminal 912 connected to the word-line 96 and a third terminal 913. The pulling element 92 comprises a first terminal 921, a second terminal 922, a third terminal 923 (which may be connected to the ground or a negative system voltage), and a fourth terminal 924 (which may be connected to a system voltage), thereby being capable of providing pull-up and pull-down paths.

Like the read port 91, the complementary read port 93 comprises a first terminal 931 connected to a complementary bit-line 95a, a second terminal 932 connected to the complementary word-line 96a and a third terminal 933. Like the pulling element 92, the complementary pulling element 94 comprises a first terminal 941, a second terminal 942, a third terminal 943 (which may be connected to the ground or a negative system voltage), and a fourth terminal 944 (which may be connected to a system voltage), thereby being capable of providing pull-up and pull-down paths. The complementary part may at least allow the additional output of a signal that is complementary to (e.g., the logical inverse of) the signal at the bit-line 95 at the complementary bit-line 95a.

The information storage 97 is capable of storing, in some embodiments, one bit of information. The bit may be passed to the bit-lines 95 and 95a via the terminal 971 and the complementary terminal 972. The information storage 97 may be electric, magnetic, or any other type of suitable storage elements.

FIGS. 10A-10D illustrate the schematics and exemplary layouts thereof employing the circuit structures according to some embodiments of the present disclosure.

Figure 10A:
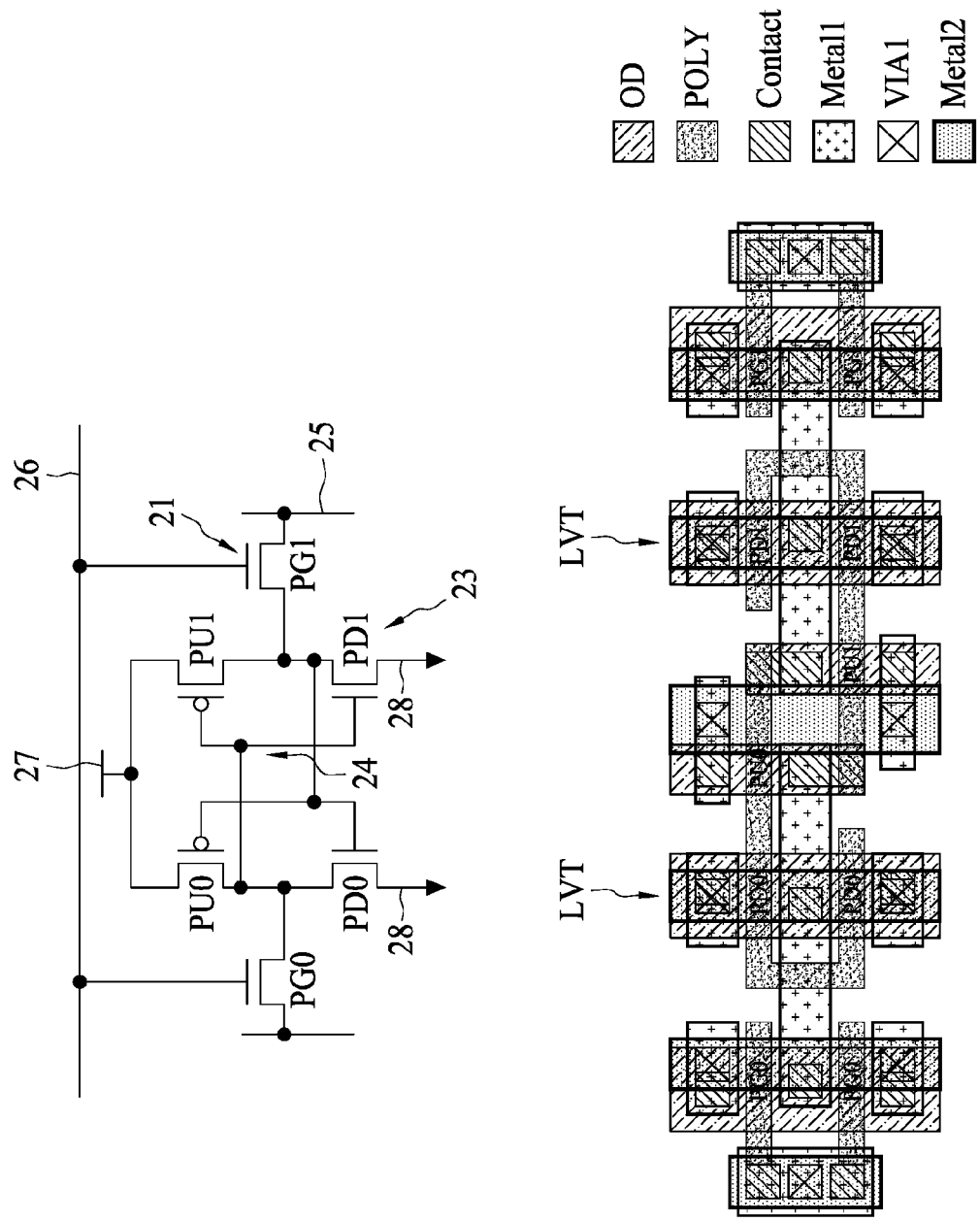
FIGS. 10A-10D illustrate the circuit and exemplary layouts thereof employing the circuit structures in accordance with some embodiments of the present disclosure.

FIG. 10A illustrates a 6-transistor ("6T") memory cell, in which the transistors are labeled as PD0, PD1, PU0, PU1, PG0 and PG1 for ease of reference in the accompanying layout. Exemplary elements in the layout, as indicated in the legend in FIG. 10A, include oxide diffusion (OD), polysilicon (POLY), contact (CONTACT), metal 1 and 2 layers (Metal 1, Metal 2), and via (VIA 1). In this embodiment, the transistor PG1 may serve as the read port 21, connected to the bit-line 25 and the word-line 26. Four transistors PD0, PD1, PU0 and PU1 form a pair of cross-coupled inverters, which is coupled to the transistors PG0 and PG1. The input nodes to the cross-coupled inverters may act as the information storage 24. For example, the input node to the inverter on the right, formed by the transistors PU1 and PD1, is capable of storing a low voltage (i.e., representing a logical zero) or a high voltage (i.e., representing a logical one). In this example also, the complementary information is stored at the input node to the inverter on the left. The transistor PD1 may serve as the pulling element 23. If a high voltage is stored at the input to the inverter on the right, this high voltage would turn on the transistor PD during a read operation, where the bit-line 25 is pre-charged and the word-line 26 is asserted, thereby establishing an electrical path between the bit-line 25 and the ground 28 and pulling down the bit-line 25. The threshold voltage of the transistors PD0 and PD1 may be respectively lower than the transistors PG0 and PG1. As indicated in the layout in FIG. 10A, the transistors PD0 and PD1 are LVT. Please note that employing the multi-threshold-voltage circuit structure in a memory cell like the one in FIG. 10A not only improves the on-current and the ratio of the on-current to the off-current, but also improves the static noise margin (SNM) of the memory cell because a larger β ratio (defined as the ratio of the strength of PD over the strength of PG) improves the SNM. In other words, if PD is LVT and PG is HVT, the resulting β ratio would become larger, thereby improving the SNM.

Figure 10B:
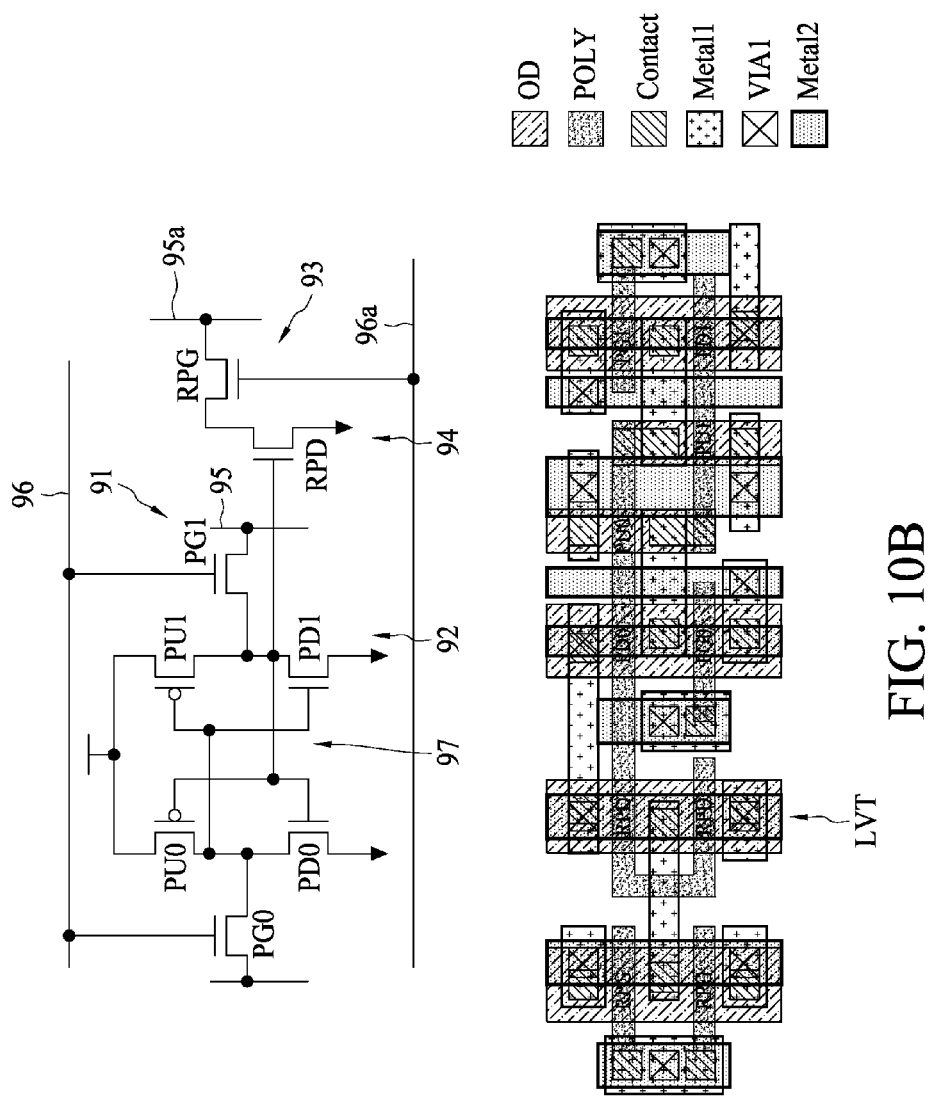

FIG. 10B illustrates a 2-port 8-transistor ("2P8T") memory cell, in which some of the transistors are labeled as PD0, PD1, PU0, PU1, PG0, PG1, RPD and RPG for ease of reference in the accompanying layout. The memory cell in FIG. 10B implements the block diagram in FIG. 9, in which complementary parts are provided. Four transistors PD0, PD1, PU0 and PU1 form a pair of cross-coupled inverters. The input nodes to the cross-coupled inverters may act as the information storage 97. The transistors PD1 and PG1 may serve as the pulling element 92-read port 91 pair, coupled to the bit-line 95 and word-line 96. The transistors RPD and RPG may serve as the complementary pulling element 94-complementary read port 93 pair, coupled to the complementary bit-line 95 and complementary word-line 96a. As indicated in the layout in FIG. 10B, the transistor RPD is LVT, but other transistors (e.g., those acting as the pulling element) may also be LVT when appropriate.

Figure 10C:
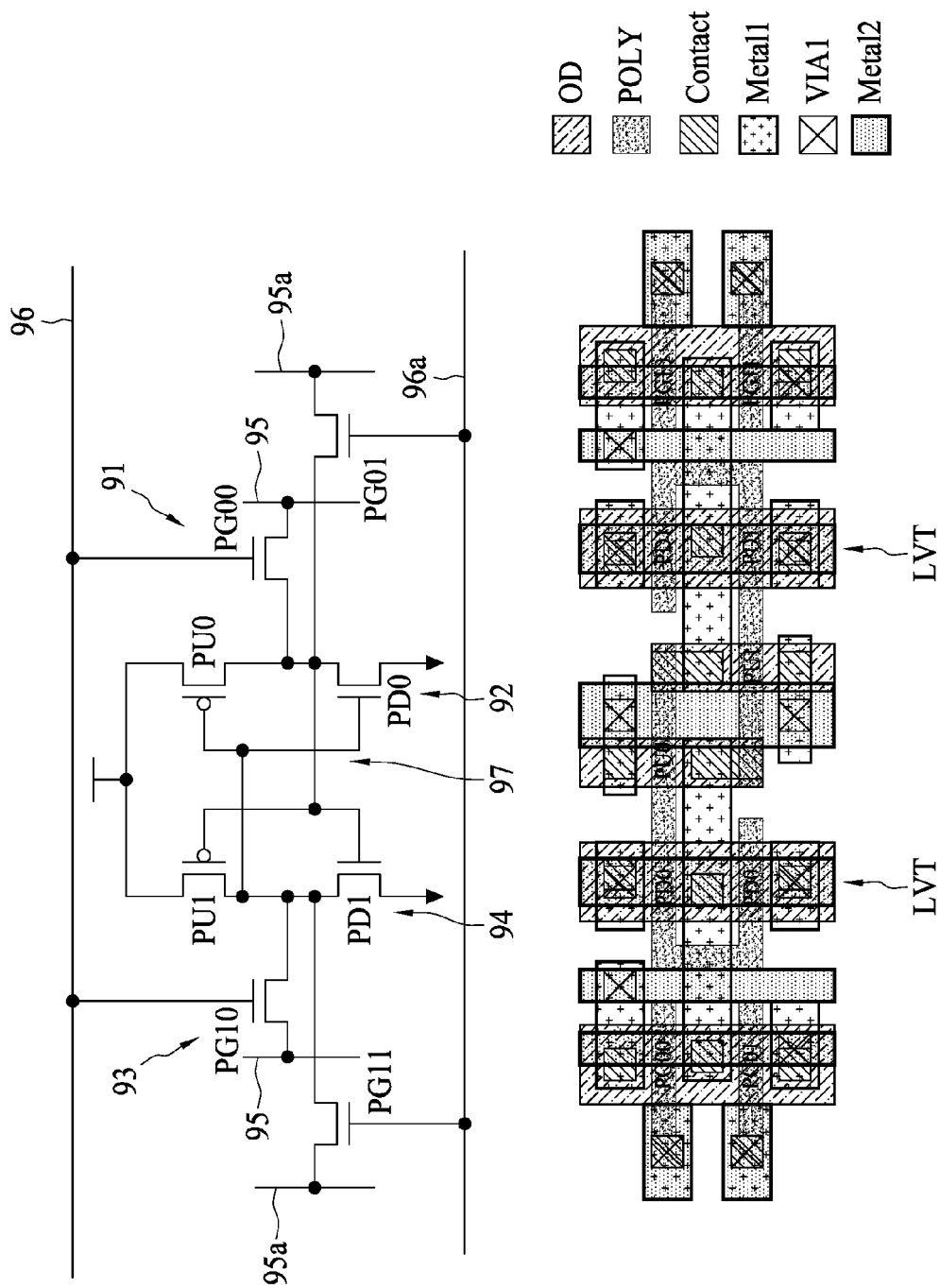

FIG. 10C illustrates another 2P8T memory cell, in which the transistors are labeled as PD0, PD1, PU0, PU1, PG00, PG01, PG10 and PG11 for ease of reference in the accompanying layout. Note that more than one transistor may serve as the read port 91 and the complementary read port 93. As indicated in the layout in FIG. 10C, the transistors PD0 and PD1 (which may respectively serve as the pulling element 92 and the complementary pulling element 94) are LVT.

Please note that since there exists a tradeoff between the size of the transistor representing the pulling element 92 and the noise performance (e.g., SNM) of the memory cell, the multi-threshold-voltage circuit structure may improve the noise performance without the need for enlarging said transistor. Since the size of the transistor(s) representing the pulling element 92 could be double the size of the transistor(s) representing the read port 91, the size of the pulling element 92 dominates more and thus the benefit of the multi-threshold-voltage circuit structure becomes more apparent. In the embodiment in FIG. 10C, using the multi-threshold-voltage circuit structure may maintain the same noise performance while providing a 30% reduction in the area of the transistors PD0/PD1 and a 10% reduction in the area of the memory cell.

Figure 10D:
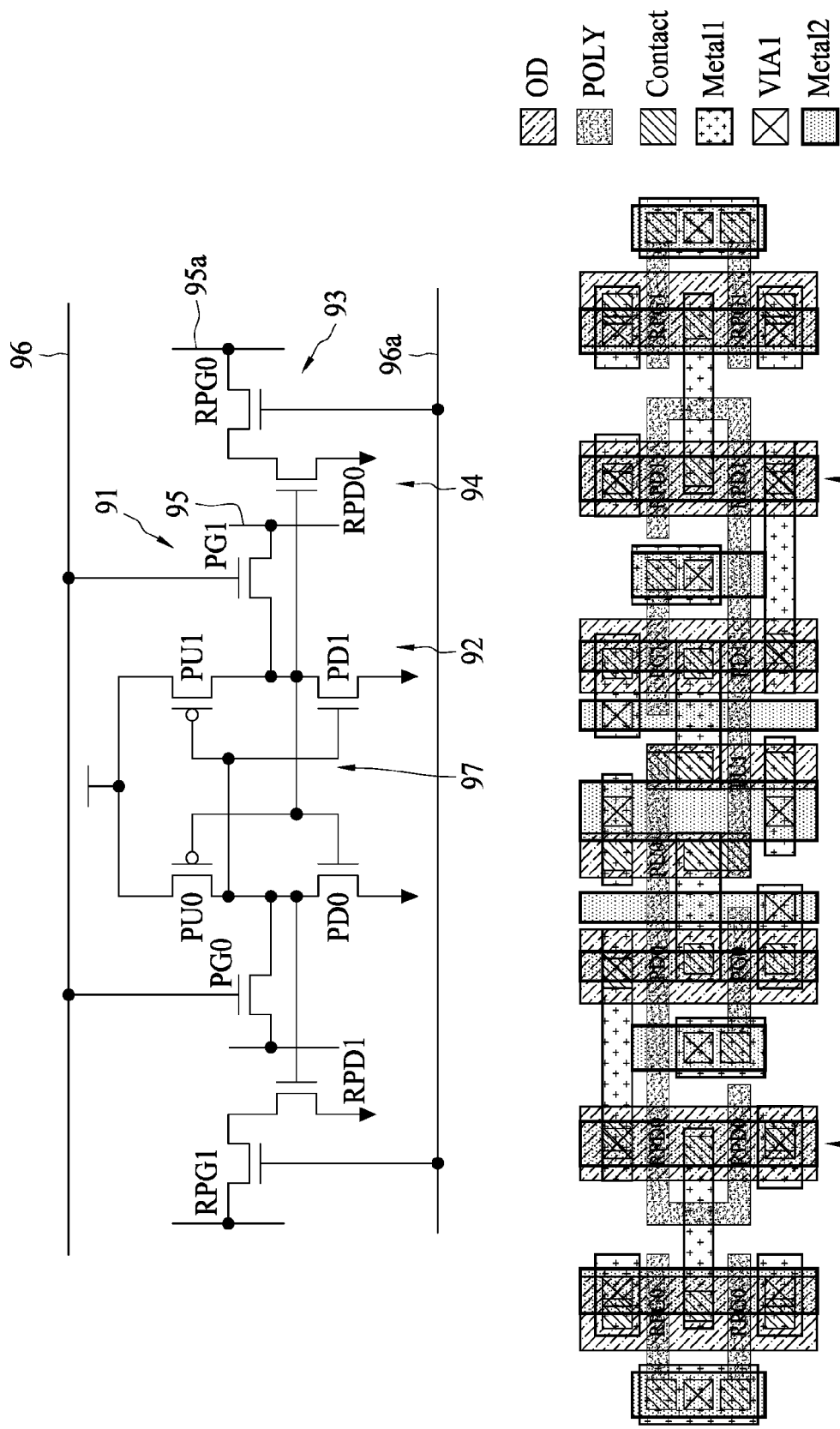

FIG. 10D illustrates a 2-port 10-transistor ("2P10T") memory cell, in which the transistors are labeled for ease of reference in the accompanying layout. Like the memory cells in FIGS. 10A-10C, the input nodes to the four-transistor cross-coupled inverter pair (PD0, PD1, PU0, and PU1) may serve as the information storage 97. In FIG. 10D, more than one transistor may serve as the read port 91, the pulling element 92, the complementary read port 93 and the complementary pulling element 94. The transistors RPD0 and RPD1 are set to be LVT, but other transistors capable of serving as the pulling element may also be set to LVT.

The application of the idea behind the aforementioned embodiments of the present disclosure is not limited to memory circuits and may be extended to generic digital logic circuits as well.

Figure 11:
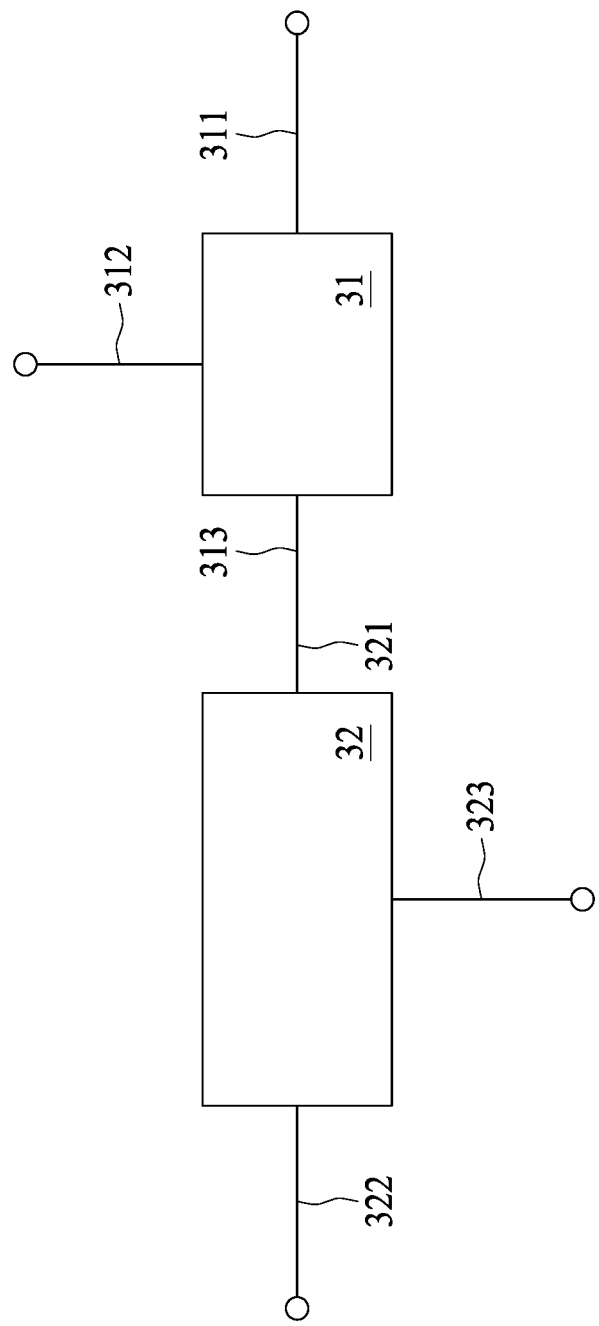
FIG. 11 illustrates the block diagram of a part of a digital logic circuit in accordance with some embodiments of the present disclosure.

FIG. 11 illustrates the block diagram of a part of a digital logic circuit, comprising a switch element 31 and a pulling element 32. The switch element 31 appears frequently in digital logic circuits so as to control the passage of voltage/current in and out of a certain circuit block. The pulling element 32 is also frequently present in digital logic circuits so as to provide pull-up and pull-down paths to control the voltage level at certain circuit nodes. The switch element 31 and the pulling element 32 may be respectively associated with first and second threshold voltages that affect the operation thereof.

In some embodiments, the switch element 31 comprise an output terminal 311, a switch control terminal 312 and an interconnection terminal 313. The output terminal 311 may be capable of outputting a digital signal. The switch control terminal 312 may be capable of controlling the on/off status of the switch element 31. The interconnection terminal 313 may connect the switch element 31 to other circuit blocks.

In some embodiments, the pulling element 32 comprises an interconnection terminal 321, an input terminal 322 and a pulling terminal 323. The interconnection terminal 321 may connect the pulling element 32 to other circuit blocks, such as the switch element 31. The input terminal 322 may be capable of receiving a digital signal to be passed to the output terminal 311 of the switch element 31 (if and when the switch element 31 is turned on). The pulling terminal 323 may be capable of pulling the voltage at the interconnection terminal 321 up or down.

As in any digital circuits, undesirable off current may be present in the digital logic circuit in FIG. 11. For example, if there exists an undesirably significant amount of off current between the output terminal 311 of the switch element 31 and the pulling terminal 323 of the pulling element 32 when the switch element 31 and the pulling element 32 are not supposed to be on, the signal level at the output terminal 311 may be inaccurate and lead to errors.

As mentioned before, one way to suppress the off-current is to unilaterally increase both the first and second threshold voltages. This, however, may decrease the speed, which is an important performance factor of digital circuits.

Nevertheless, careful analysis reveals that if the off-current is more affected by one of the switch element 31 and the pulling element 32, then increasing the threshold voltage corresponding to that block may suffice.

Figures 12A, 12B:
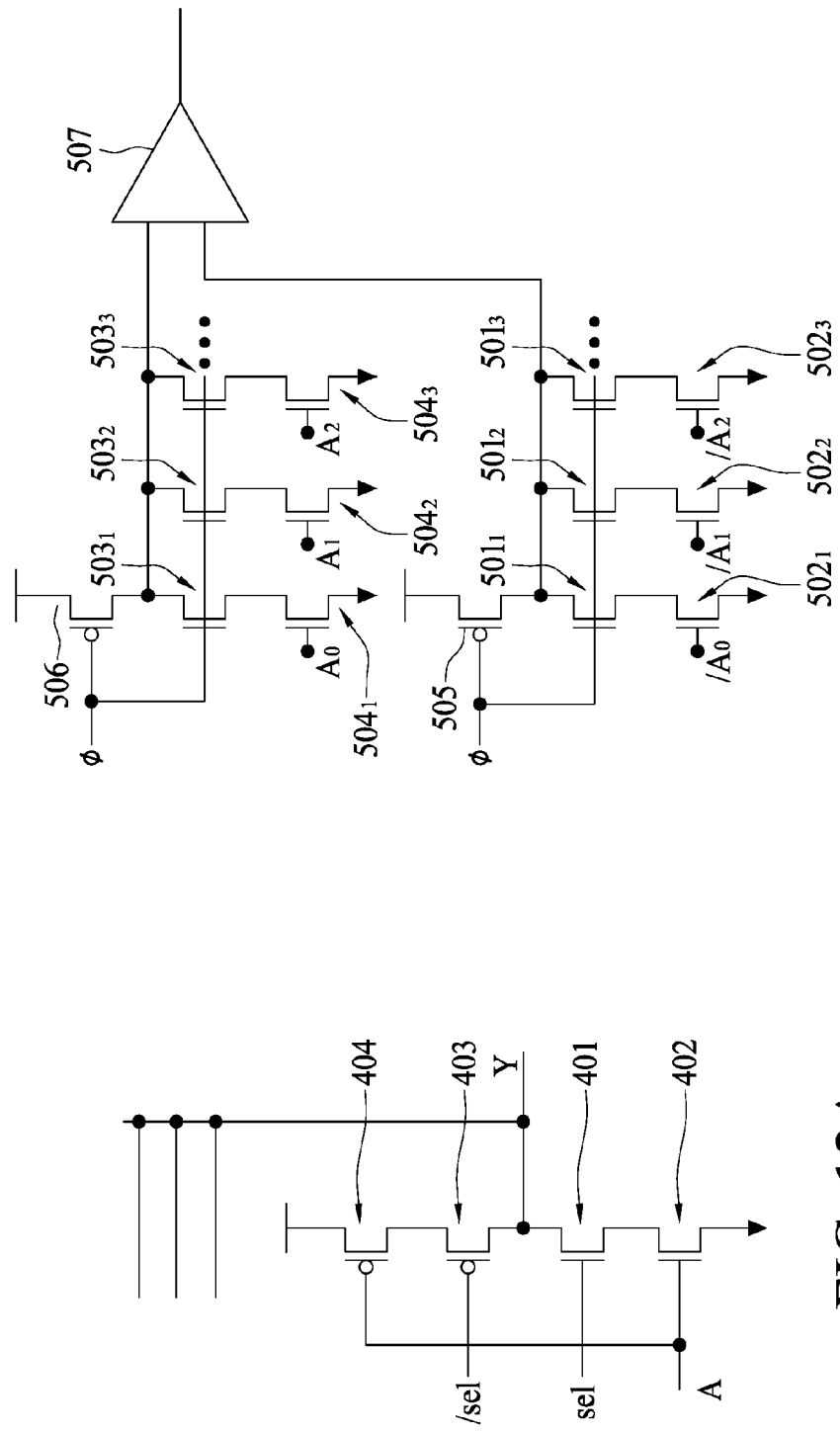
FIGS. 12A and 12B illustrate digital logic circuit structures in accordance with some embodiments of the present disclosure.

FIGS. 12A and 12B illustrate digital logic circuit structures according to some embodiments of the present disclosure. FIG. 12A presents a selector; FIG. 12B, a majority-logic.

The selector in FIG. 12A comprises an input A, an output Y and two complementary selection inputs (referred to as sel and /sel), all connected via transistors 401, 402, 403, 404. When the sel input is raised, the transistors 401, 403 are on, permitting the output Y to be affected by the input A. When the sel input is lowered, the transistors 401, 403 are off, preventing the output Y from being affected by the input A. It is desirable to limit the current when the transistors 401, 403 are off; otherwise the output Y may be affected by the input A when it should not be affected. To achieve this goal, the threshold voltage of the transistors 401, 403 may be set to be respectively higher than that of the transistors 402, 404.

FIG. 12B illustrates a dynamic majority logic circuit, where the clock signal is denoted by ϕ and the complementary inputs are denoted by $A_0, /A_0, A_1, /A_1, A_2, /A_2$, etc. The circuits comprises a comparator 507 (or an operational amplifier) and transistors $501_i, 502_i, 503_i, 504_i$, 505 and 506, where i=1, 2, 3, etc. In order to reduce the amount of current when there is no comparison actively occurring (i.e., when the clock signal ϕ is low), the threshold voltage of the transistors $501_i$ may be set to be respectively higher than that of the transistors $502_i$. Similarly, the threshold voltage of the transistors 503 may be set to be respectively higher than that of the transistors $504_i$.

In sum, by identifying the part of the digital circuit that has more impact on the amount of undesirable off-current, a higher threshold voltage may be precisely targeted at that part, thereby avoiding the deficiency of blindly raising the threshold voltage of all parts of the digital circuit.

In accordance with some embodiments of the present disclosure, a circuit structure is provided. The circuit structure comprises a first transistor, a second transistor, a storage node and a word-line. Each of the two transistors comprises a gate, a source and a drain. The storage node is connected to the gate of the first transistor. The word-line is connected to the gate of the second transistor. The first and second transistors are serially connected. The first and second threshold voltages are respectively associated with the first and second transistors, and the first threshold voltage is lower than the second threshold voltage.

In accordance with some embodiments of the present disclosure, an SRAM cell structure is provided. The SRAM cell structure comprises a read port, a pulling element, a bit-value storage element, a bit-line and a word-line. The read port comprises a first terminal, a second terminal and a third terminal, and is associated with a read-port threshold voltage. The read-port threshold voltage is higher than the pulling-element threshold voltage. The pulling element comprises a first terminal and a second terminal, and is associated with a pulling-element threshold voltage. The first terminal of the pulling element is connected to the third terminal of the read port. The bit-value storage element comprises an output terminal connected to the second terminal of the pulling element. The bit-line is connected to the first terminal of the read port. The word-line is connected to the second terminal of the read port.

In accordance with some embodiments of the present disclosure, a digital circuit structure with a controlled off-current is provided. The digital circuit structure comprises a switch element and a pulling element. The switch element comprises an output terminal, a switch-control terminal and an interconnection terminal, and is associated with a first threshold voltage. The pulling element comprises a pulling terminal, an input terminal and an interconnection terminal, and is associated with a second threshold voltage. The interconnection terminal of the switch element is connected to the interconnection terminal of the pulling element. The first threshold voltage is higher than the threshold voltage.

In accordance with some embodiments of the present disclosure, a logic circuit structure with a controlled off-current is provided. The logic circuit structure with a controlled off-current comprises a plurality of pairs, each of which comprises a switch element and a pulling element. Each switch element comprises an output terminal, a switch-control terminal and an interconnection terminal; each switch element is associated with a switch-element threshold voltage; each pulling element comprises a pulling terminal, an input terminal and an interconnection terminal; and each pulling element is associated with a pulling-element threshold voltage. The respective interconnection terminal of each switch element is coupled to the respective interconnection terminal of each pulling element. The respective switch-element threshold voltage of each switch element is higher than the respective pulling-element threshold voltage of each pulling element. The output terminals of all the switch elements of said plurality of pairs are coupled to each other. The logic circuit structure with a controlled off-current also comprises a plurality of complementary pairs, each of which comprises a switch element and a pulling element. Each switch element comprises an output terminal, a switch-control terminal and an interconnection terminal; each switch element is associated with a switch-element threshold voltage; each pulling element comprises a pulling terminal, an input terminal and an interconnection terminal; and each pulling element is associated with a pulling-element threshold voltage. The respective interconnection terminal of each switch element is coupled to the respective interconnection terminal of each pulling element. The respective switch-element threshold voltage of each switch element is higher than the respective pulling-element threshold voltage of each pulling element. The output terminals of all the switch elements of said plurality of complementary pairs are coupled to each other. The logic circuit structure with a controlled off-current further comprises a comparator comprising a first input and a second input, with the output terminals of the switch elements of said plurality of pairs being coupled to the first input of the comparator and the output terminals of the switch elements of said plurality of complementary pairs being coupled to the second input of the comparator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An SRAM cell structure, comprising:
   a first inverter configured with a first input and a first output;
   a second inverter configured with a second input and a second output;
   wherein
      the first input is electrically coupled to the second output to form a first storage node; and
      the second input is electrically coupled to the first output to form a second storage node;
   a first transistor configured to form a first conduction path between a first data line and the second storage node which connects or disconnects in response to a first control line;
   a second transistor configured to form a second conduction path between a second data line and the first storage node which connects or disconnects in response to the first control line;
   a transistor of the first inverter and a transistor of the second inverter have a first threshold voltage;
   the first transistor and the second transistor have a same conductivity type as the transistor of the first inverter and the transistor of the second inverter and have a second threshold voltage; and
   an absolute value of the first threshold voltage is lower than an absolute value of the second threshold voltage, wherein
      an area of the transistor of the first inverter is reduced by a first factor and an area of the transistor of the second inverter is reduced by the first factor; and
      the first factor is below a value which results in a first noise performance associated with the first storage node and the second storage node of the SRAM cell structure to be the same as a second noise performance associated with the first storage node and the second storage node of another SRAM cell structure with the transistor of the first inverter and the transistor of the second inverter having the second threshold voltage.

2. The SRAM cell structure of claim 1, wherein
   the transistor of the first inverter and the transistor of the second inverter are electrically coupled to a lower power supply and are n-channel field effect transistors; and
   the first transistor and the second transistor are n-channel field effect transistors.

3. The SRAM cell structure of claim 1, wherein
   the transistor of the first inverter and the transistor of the second inverter are electrically coupled to a higher power supply and are p-channel field effect transistors; and
   the first transistor and the second transistor are p-channel field effect transistors.

4. The SRAM cell structure of claim 1, further comprising:
   a third transistor configured to electrically couple a third data line to the second storage node in response to a second control line; and
   a fourth transistor configured to electrically couple a fourth data line to the first storage node in response to the second control line.

5. The SRAM cell structure of claim 1, wherein
   the first transistor comprises:
      a first diffusion area;
      a first gate line crossing the first diffusion area;
      a second gate line crossing the first diffusion area and in parallel to the first gate line;
   the first gate line is electrically coupled to the second gate line through the first control line using a layer different from that of the first gate line and the second gate line; and
   the transistor of the first inverter comprises:
      a second diffusion area on one side of the first diffusion area along a direction of the first gate line;
      a third gate line crossing the second diffusion area;
      a fourth gate line crossing the second diffusion area and in parallel to the third gate line;
      a first connection structure in a direction bent from that of the third gate line;
   the third gate line is electrically coupled to the fourth gate line through the first connection structure;
   the third gate line, the fourth gate line and the first connection structure are used to form the first input; and
   the second storage node comprises:
      a portion of the first diffusion area between the first gate line and the second gate line and a portion of the second diffusion area between the third gate line and the fourth gate line; and
      a second connection structure electrically coupling the portion of the first diffusion area to the portion of the second diffusion area.

6. The SRAM cell structure of claim 5, wherein
   the first connection structure is a connection line in the same layer as the third gate line and the fourth gate line.

7. The SRAM cell structure of claim 5, wherein
   the second connection structure comprises:
      a first contact contacting the first diffusion area;
      a second contact contacting the second diffusion area; and
      a conductive line electrically coupled to the first diffusion area and the second diffusion area through the corresponding first contact and the second contact.

8. The SRAM cell structure of claim 5, wherein
   the second connection structure comprises:
      a first contact contacting the first diffusion area and the second diffusion area.

9. The SRAM cell structure of claim 1, wherein
   the first transistor comprises:
      a first diffusion area;
      a first gate line crossing the first diffusion area;
   the first gate line is electrically coupled to the first control line;

the transistor of the first inverter comprises:
  a second diffusion area on one side of the first diffusion area long a direction of the first gate line;
  a second gate line crossing the second diffusion area and in parallel to the first gate line;
the second gate line is used to form the first input; and
the second storage node comprises:
  a portion of the first diffusion area and a portion of the second diffusion area between the first gate line and the second gate line; and
  a conductive structure electrically coupling the portion of the first diffusion area to the portion of the second diffusion area.

10. A circuit structure, comprising:
a first transistor a source of which is electrically coupled to a higher power supply;
a second transistor a source of which is electrically coupled to a lower power supply, a drain of which is electrically coupled to a drain of the first transistor and a gate of which is electrically coupled to a gate of the first transistor;
a third transistor a source of which is electrically coupled to the higher power supply;
a fourth transistor a source of which is electrically coupled to the lower power supply, a drain of which is electrically coupled to a drain of the third transistor and a gate of which is electrically coupled to a gate of the third transistor;
wherein
  the gates of the first transistor and the second transistor are electrically coupled to the drains of the third transistor and the fourth transistor to form a first storage node; and
  the gates of the third transistor and the fourth transistor are electrically coupled to the drains of the first transistor and the second transistor to form a second storage node;
a fifth transistor configured to form a first conduction path between a first source or drain of the fifth transistor and the second storage node which connects or disconnects in response to a gate of the fifth transistor;
the gate of the fifth transistor is electrically configured to be capable of being held at a different potential from the gates of the first transistor and the second transistor;
a sixth transistor configured to form a second conduction path between a first source or drain of the sixth transistor and the first storage node which connects or disconnects in response to a gate of the sixth transistor;
the gate of sixth transistor is electrically configured to be capable of being held at a different potential from the gates of the third transistor and the fourth transistor;
one first pair of transistors of the pair of first transistor and third transistor and the pair of second transistor and fourth transistor have a first threshold voltage;
the pair of fifth transistor and sixth transistor have a same conductivity type as the first pair of transistors and have a second threshold voltage; and
an absolute value of the first threshold voltage is lower than an absolute value of the second threshold voltage, wherein
  an area of the first pair of transistors is reduced by a first factor; and
  the first factor is a positive number and is below a value which results in a first noise performance associated with the first storage node and the second storage node of the circuit structure to be the same as a second noise performance associated with the first storage node and the second storage node of another circuit structure with the first pair of transistors having the second threshold voltage.

11. The circuit structure of claim 10, wherein
the first pair of transistors are electrically coupled to the lower power supply and are n-channel field effect transistors; and
the pair of fifth transistor and sixth transistor are n-channel field effect transistors.

12. The circuit structure of claim 10, wherein
the first pair of transistors are electrically coupled to the lower power supply and are p-channel field effect transistors; and
the pair of fifth transistor and sixth transistor are p-channel field effect transistors.

13. The circuit structure of claim 10, wherein
the fifth transistor comprises:
  a first diffusion area;
  a first gate line crossing the first diffusion area;
  a second gate line crossing the first diffusion area and in parallel to the first gate line;
  a first connection structure in a direction bent from that of the first gate line and electrically coupling the first gate line to the second gate line;
the first gate line, the second gate line and the first connection line are used to form the gate of the fifth transistor;
one transistor of the first transistor and the second transistor which is of the same conductivity type as the fifth transistor comprises:
  a second diffusion area on one side of the first diffusion area along a direction of the first gate line;
  a third gate line crossing the second diffusion area;
  a fourth gate line crossing the second diffusion area and in parallel to the third gate line;
  a second connection structure in a direction bent from that of the third gate line and electrically coupling the third gate line to the fourth gate line;
the third gate line, the fourth gate line and the second connection structure are used to form the gate of the one transistor of the first transistor and the second transistor; and
the second storage node comprises:
  a portion of the first diffusion area between the first gate line and the second gate line and a portion of the second diffusion area between the third gate line and the fourth gate line; and
  a third connection structure electrically coupling the portion of the first diffusion area to the portion of the second diffusion area.

14. The circuit structure of claim 13, wherein
the first connection structure comprises:
  a conductive line in a different layer from that of the first gate line and the second gate line.

15. The circuit structure of claim 13, wherein
the second connection structure is a conductive line in the same layer as the third gate line and the fourth gate line.

16. The circuit structure of claim 13, wherein
the third connection structure comprises:
  a first contact contacting the first diffusion area;
  a second contact contacting the second diffusion area; and
  a conductive line electrically coupled to the first diffusion area and the second diffusion area through the first contact and the second contact.

17. The circuit structure of claim 13, wherein
the third connection structure comprises:
a first contact contacting the first diffusion area and the second diffusion area.
18. The circuit structure of claim 13, wherein
the fifth transistor comprises:
a first diffusion area;
a first gate line crossing the first diffusion area;
the first gate line is used to form the gate of the fifth transistor;
one transistor of the first transistor and the second transistor which is of the same conductivity type as the fifth transistor comprises:
a second diffusion area on one side of the first diffusion area long a direction of the first gate line;
a second gate line crossing the second diffusion area and in parallel to the first gate line;
the second gate line is used to form the gate of the one transistor of the first transistor and the second transistor; and
the second storage node comprises:
a portion of the first diffusion area and a portion of the second diffusion area between the first gate line and the second gate line; and
a conductive structure electrically coupling the portion of the first diffusion area to the portion of the second diffusion area.
19. An SRAM cell structure, comprising:
a first transistor a source of which is electrically coupled to a higher power supply;
a second transistor a source of which is electrically coupled to a lower power supply, a drain of which is electrically coupled to a drain of the first transistor to form a first output and a gate of which is electrically coupled to a gate of the first transistor to form a first input;
a third transistor a source of which is electrically coupled to the higher power supply;
a fourth transistor a source of which is electrically coupled to the lower power supply, a drain of which is electrically coupled to a drain of the third transistor to form a second output and a gate of which is electrically coupled to a gate of the third transistor to form a second input,
wherein
the first input is electrically coupled to the second output to form a first storage node; and
the second input is electrically coupled to the first output to form a second storage node;
a fifth transistor configured to form a first conduction path between a first data line and the second storage node which connects or disconnects in response to a first control line;
a sixth transistor configured to form a second conduction path between a second data line and the first storage node which connects or disconnects in response to the first control line;
one first pair of transistors of the pair of first transistor and third transistor and the pair of second transistor and fourth transistor have a first threshold voltage;
the pair of fifth transistor and sixth transistor have a same conductivity type as the first pair of transistors and have a second threshold voltage; and
an absolute value of the first threshold voltage is lower than an absolute value of the second threshold voltage,
wherein
an area of the first pair of transistors is reduced by a first factor; and
the first factor is a positive number and is below a value which results in a first noise performance associated with the first storage node and the second storage node of the SRAM cell structure to be the same as a second noise performance associated with the first storage node and the second storage node of another SRAM cell structure with the first pair of transistors having the second threshold voltage.
20. The SRAM cell structure of claim 19, wherein
the fifth transistor comprises:
a first diffusion area;
a first gate line crossing the first diffusion area;
a second gate line crossing the first diffusion area and in parallel to the first gate line;
the first gate line is electrically coupled to the second gate line through the first control line using a layer different from that of the first gate line and the second gate line; and
one transistor of the first transistor and the second transistor which is of the same conductivity type as the fifth transistor comprises:
a second diffusion area on one side of the first diffusion area along a direction of the first gate line;
a third gate line crossing the second diffusion area;
a fourth gate line crossing the second diffusion area and in parallel to the third gate line;
a first connection structure in a direction bent from that of the third gate line;
the third gate line is electrically coupled to the fourth gate line through the first connection structure;
the third gate line, the fourth gate line and the first connection structure are used to form the first input; and
the second storage node comprises:
a portion of the first diffusion area between the first gate line and the second gate line and a portion of the second diffusion area between the third gate line and the fourth gate line; and
a second connection structure electrically coupling the portion of the first diffusion area to the portion of the second diffusion area.

* * * * *